United States Patent [19]

Toohey

[11] Patent Number: 4,987,321
[45] Date of Patent: Jan. 22, 1991

[54] PROCESSING CIRCUIT FOR IMAGE SENSOR

[75] Inventor: William J. Toohey, Pittsford, N.Y.

[73] Assignee: Eastman Kodak Company, Rochester, N.Y.

[21] Appl. No.: 412,065

[22] Filed: Sep. 25, 1989

[51] Int. Cl.$^5$ .................. H03K 5/00; H03K 5/159; H01G 1/00

[52] U.S. Cl. .................. 307/520; 307/353; 328/151; 328/158; 328/162; 328/163; 358/213.15; 358/213.23

[58] Field of Search .............. 328/151, 158, 162, 163, 328/165; 307/520, 521, 353, 352; 358/213.15, 213.23

[56] References Cited

U.S. PATENT DOCUMENTS

| | | | |
|---|---|---|---|
| 3,332,012 | 7/1967 | Frommer et al. | 324/140 |
| 3,521,141 | 7/1970 | Walton | 320/1 |
| 3,599,103 | 8/1971 | Nussbaumer | 328/135 |
| 4,000,366 | 12/1976 | Sirrine | 328/163 |
| 4,079,423 | 3/1978 | Diehl | 358/213 |
| 4,096,402 | 6/1978 | Schroeder et al. | 307/362 |
| 4,255,715 | 3/1981 | Cooperman | 330/9 |
| 4,262,258 | 4/1981 | Gaalema | 307/353 |
| 4,274,113 | 6/1981 | Ohba et al. | 358/212 |
| 4,283,742 | 8/1981 | Izumita et al. | 358/213 |
| 4,333,111 | 6/1982 | Noda et al. | 358/213 |
| 4,385,321 | 5/1983 | Malm | 358/213 |
| 4,600,843 | 7/1986 | Kizu et al. | 250/578 |
| 4,617,593 | 10/1986 | Dudley | 358/113 |
| 4,823,027 | 4/1989 | Takahashi | 307/353 |
| 4,845,382 | 7/1989 | Eouzan et al. | 307/358 |

Primary Examiner—Timothy P. Callahan
Attorney, Agent, or Firm—Raymond L. Owens

[57] ABSTRACT

Processing circuitry, which cancels noise and distortions from an imaging system which has a charge coupled device, has four sample and hold circuits, two buffer circuits and a pair of source followers which are all on a common semiconductor substrate and further has a differential amplifier which is not on the common substrate.

4 Claims, 2 Drawing Sheets

PROCESSING CIRCUIT FOR IMAGE SENSOR

CROSS-REFERENCE TO RELATED APPLICATIONS

This patent application is related to a copending patent application, Ser. No. 412,064, which is being filed concurrently and in which there is a common inventor and a common assignee.

FIELD OF THE INVENTION

This invention relates to solid/state imaging apparatus and in particular to distortion and noise reduction in the signal processing of video signals generated in Charge Coupled Devices (CCDs) or photodiodes.

BACKGROUND OF THE INVENTION

One popular form of solid state image sensor is a CCD which converts a light signal (an image) incident upon a photosensitive input electrode thereof and generates at an output electrode thereof an electrical (video) signal corresponding to the light signal. A light sensing CCD typically comprises a p type semiconductor substrate with an insulating layer of silicon dioxide covering a maJor surface thereof and a plurality of spaced apart electrodes (gates) over the insulating layer. The electrodes are photosensitive and light incident thereon effectively generates charge carriers in a portion of the substrate therebelow. Adjacent electrodes are biased such that a potential well is created in the substrate under one of the electrodes but not under the other. Light incident on a pair of adjacent electrodes induces charge carriers in the substrate under both electrodes. The charge carriers under the electrode with the well thereunder are held in the well and the charge carriers under the other electrode are attracted toward and flow into the well. Charge carriers are moved in the substrate from under one electrode to another by changing the relative biasing of adjacent electrode. Typically complementary digital voltages provide the biasing which causes charge carriers to move in the substrate from under one electrode to under the next electrode. Thus the CCD acts as a shift register with light induced charged being transferred (shifted) from one electrode to subsequent electrodes and then to an output electrode where it is read out as an electrical (video) signal. One problem with this type of image sensor is that the digital voltages used to shift (transfer) charge from under one electrode to another introduces distortion and noise into the generated video signal which is undesirable.

Another popular form of solid-state image sensor uses a photodiode coupled to a CCD. The CCD is essentially as described herein above except that it does not have a photosensitive electrode. This system also introduces noise and distortion due to the operation of the CCD.

U.S. Pat. No. 4,283,742 (M. Izumita et al), issued Aug. 11, 1981, describes and shows (see FIGS. 4 and 6) signal processing circuits in block diagram. Izumita et al teaches that these circuits are capable of limiting spike noise from a solid-state imaging device 11 comprising an array of photodiodes with each photodiode being connected to the source-drain circuitry of a separate MOS transistor. The circuit of FIG. 6 uses three sample and hold circuits 13, 14 and 22, a monostable multivibrator 18, a pulse delay line 23 and a subtractor 17. Izumita et al is silent as to whether the components of his signal processing circuits of FIGS. 4 and 6 are on a common semiconductor substrate with the solid state imaging device 11 or if the imaging device 11 is on a separate semiconductor substrate. In either case the outputs of S/H circuits 22 and 14 of FIG. 6 couple the same noise and distortion components to the inputs of subtractor 17 which effectively cause same to be cancelled, however; the noise and distortion components also travel through the substrate and enter subtractor 17 and they are transmitted through subtractor 17 and appear at the output thereof.

It is desirable to be able to provide a high quality electrical representations of images from solid-state imaging systems which use photosensitive CCDs or photodiodes coupled to conventional CCDs.

SUMMARY OF THE INVENTION

The present invention is directed to processing circuitry for use with an imaging system which comprises an image sensor. The image sensor is typically a Charge Coupled Device (CCD) or photodiode which generate from an image an electrical representation thereof that contains noise and distortion. The processing circuitry effectively cancels the noise and distortion so as to provide a close to ideal electrical representation of the image.

In one embodiment the processing circuitry comprises first, second, third and fourth sample and hold circuits, first and second buffer circuits, first and second essentially identical sour:e followers and subtraction means. The subtraction means, which has a first input coupled to an output of the first source follower, has a second input coupled to an output of the second source follower and has an output coupled to a circuitry output terminal, subtracts signals appearing on the outputs of the source followers from ea:h other to generate an output signal which is the difference between signals appearing on the output terminals of the source followers. Input terminals of the first and second sample and hold circuits are coupled together to a circuitry input terminal. Output terminals of the first and second sample and hold circuits are coupled to input terminals of the first and second buffer circuits, respectively. Output terminals of the first and second buffer circuits are coupled to input terminals of the third and fourth sample and hold circuits, respectively. Outputs of the third and fourth sample and hold circuits are coupled to control terminals of the first and second source followers, respectively. The sample and hold circuits, the buffer circuits and the source followers are all formed on a common semiconductor body which does not include the subtraction means.

The processing circuitry operates as follows: The first sample and hold circuit is enabled while the second, third and fourth sample and hold circuits are disabled and a reference signal voltage, which includes undesirable noise, is applied to and sampled by the first sample and hold circuit. This causes a voltage to be established at the output of the first buffer circuit. Subsequently, the second sample and hold circuit is enabled and the others are disabled and an information signal, which includes undesirable noise, is applied to and sampled by the second sample and hold circuit. This causes a voltage to be established at the output of the second buffer circuit. The third and fourth sample and hold circuits are then enabled and the first and second sample and hold circuits are disabled. This causes the voltages at outputs of the first and second buffers to be transferred to the control terminals of the first and second source followers, respectively. This results in these voltages being transferred to the outputs of the first and second source followers, respectively. The subtraction means, which is typically a differential amplifier, receives these voltages from the sources followers at first and second inputs thereof. It generates at an output terminal thereof an output signal which is the difference of the two signals and which does not include the noise of either of the two applied signals. The keeping of the differential amplifier off the semiconductor body which includes the sample and hold circuits, the buffer circuits and the source followers insures that noise passing through the semiconductor body and entering the outputs of the source followers does not enter the differential amplifier except at the inputs thereof where it can be cancelled.

The invention will be better understood from the following more detailed description taken with the accompanying drawings and claims.

DETAILED DESCRIPTION

Figure 1:
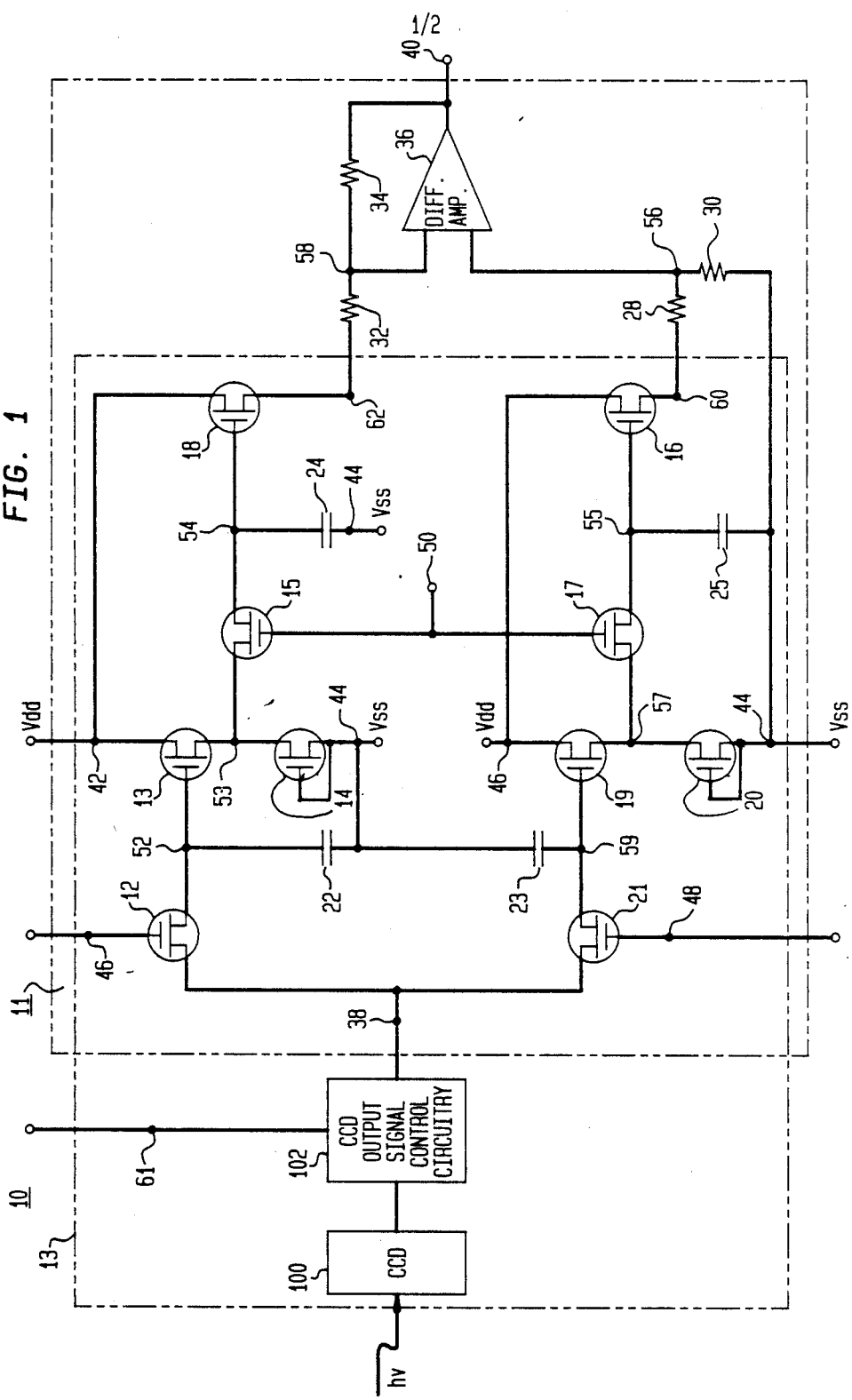
FIG. 1 is a schematic diagram of a portion of a image processing system which includes a processing circuit in accordance with the present invention.

Referring now to FIG. 1, there is shown a portion of a imaging processing system 10 comprising a Charge Coupled Device CCD 100 and CCD output signal control circuitry 102 and further comprising within a first dashed line rectangle a video image processing circuit 11 in accordance with the present invention. A light signal (image) hv is shown incident on CCD 100. Circuit 11 comprises n-channel Metal-Oxide-Semiconductor Field Effect Transistors (MOSFETs) 12, 13, 14, 15, 16, 17, 18, 19, 20 and 21, capacitors 22, 23, 24 and 25, resistors 28, 30, 32 and 34 and a differential amplifier (subtraction means) 36. Each of transistors 12, 13, 14, 15, 16, 17, 18, 19, 20 and 21 has a gate, a drain and a source which may also be denoted as the gate electrode (control terminal), the drain electrode (denoted as a first or a second output terminal) and the source electrode (denoted as a second or a first output terminal), respectively. An output of CCD 100 is coupled to an input of circuitry 102 and an output of circuitry 102 is coupled to an input terminal 38 of circuit 11 and to the drains of transistors 12 and 21. A reset control terminal 61 is coupled to control circuitry 102. Sequentially a raw video signal (V3—see FIG. 2), including distortions and noise components, and a reference voltage (V2—see FIG. 2) are applied to input terminal 38.

Circuit 11 operates to generate at an output terminal 40 thereof a substantially distortion and noise free picture or video signal V3. In a preferred embodiment CCD 100, circuitry 102 and all of the components of circuit 11 except for resistors 28, 30, 32 and 34 and differential amplifier 36 are included on a single integrated circuit chip (semiconductor body) as is indicated by the second dashed line rectangle 13. In a preferred embodiment control terminal 61 is coupled to the gates of transistors 15 and 17 and to a terminal 50.

Transistor 12 and capacitor 22 form a first sample and hold circuit; transistor 21 and capacitor 23 form a second sample and hold circuit; transistor 15 and capacitor 24 form a third sample and hold circuit; and transistor 17 and capacitor 25 form a fourth sample and hold circuit. Transistors 13 and 14 form a first buffer circuit and transistors 19 and 20 form a second buffer circuit.

The source of transistor 12 is coupled to the gate of transistor 13, to a first terminal of capacitor 22 and to a terminal 52. The source of transistor 21 is coupled to the gate of transistor 19, to a first terminal of capacitor 23 and to a terminal 59. The drains of transistors 13, 16, 18 and 19 are coupled together to a terminal 42 and to a positive voltage source Vdd. The source of transistor 13 is coupled to the drain of transistor 14, to the drain of transistor 15 and to a terminal 53. The source of transistor 15 is coupled to the gate of transistor 18, to a first terminal of capacitor 24 and to a terminal 54. The source of transistor 21 is coupled to the gate of transistor 19, to a first terminal of capacitor 23 and to a terminal 59. The source of transistor 19 is coupled to the drain of transistor 17, to the drain of transistor 20 and to a terminal 57. The source of transistor 17 is coupled to the gate of transistor 16, to a first terminal of capacitor 25 and to a terminal 55. Second terminals of capacitors 22, 23, 24 and 25, a first terminal of resistor 30 and the source and gate of transistors 14 and 20 are all coupled to a terminal 44 and a reference voltage Vss which is typically ground potential. The source of transistor 16 is coupled to a first terminal of resistor 28 and to a terminal 60. A second terminal of resistor 28 is coupled to a second terminal of resistor 30, to a first input of differential amplifier 36 and to a terminal 56. The source of transistor 18 is coupled to a first terminal of resistor 32 and to a terminal 62. A second terminal of resistor 32 is coupled to a first terminal of resistor 34, to a second input of differential amplifier 36 and to a terminal 58. A second terminal of resistor 34 is coupled to an output terminal of differential amplifier 36 and to circuit 11 output terminal 40.

Figure 3:
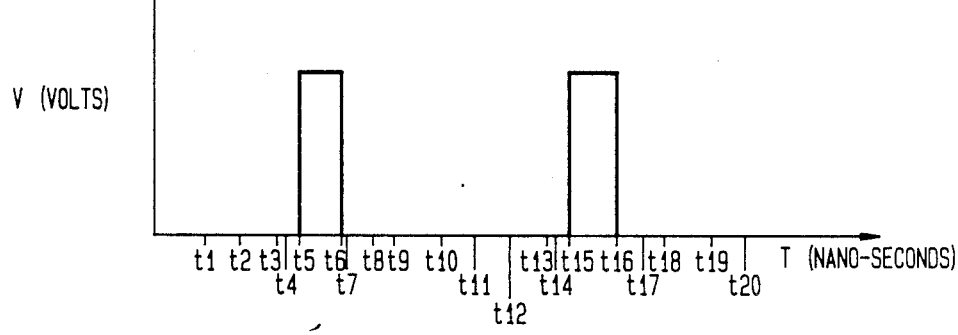
FIG. 3 graphically shows a first control signal used to control the circuit of FIG. 1.

The gate of transistor 12 is coupled to a terminal 46 to which is applied a clamp voltage wave form shown in FIG. 3. The gate of transistor 21 is coupled to a terminal 48 to which is applied a sample voltage wave form shown in FIG. 4. Transistors 12 and 21 are essentially identical as are transistors 16 and 18. The capacitance of capacitors 22 and 23 are essentially identical and the capacitances of capacitors 24 and 25 are essentially equal.

Figure 2:
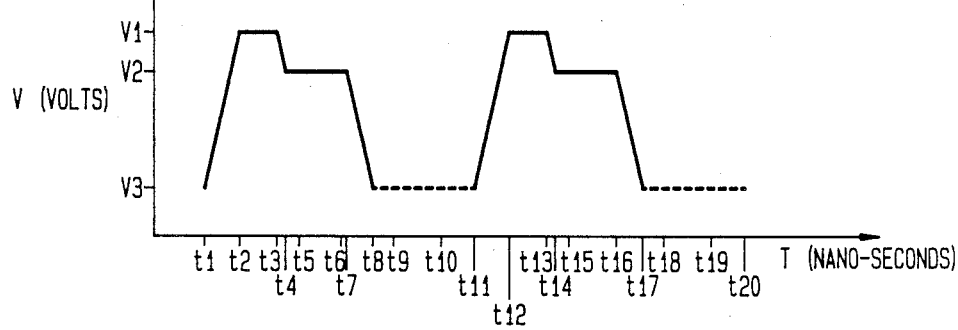
FIG. 2 graphically shows an input signal to the circuit of FIG. 1.

Referring now to FIG. 2, there is graphically shown an illustrative output signal from circuitry 102 which is applied to input terminal 38 with voltage V(volts) plotted on the y axis and time T(nano seconds) plotted on the x axis. Between T=t1 and t2, circuitry 102 provides a reset which at T=t2 leaves input terminal 38 at a voltage level V1 that is maintained in the time period T=t2 to t3. Between T=t3 and t4 the wave form applied to input terminal 38 makes a transition to a reference voltage level V2 which is less positive than V1. Voltage level V2 is maintained during the time period T=t4 to t7 and contains distortions and noise associated with CCD 100 and circuitry 102. At T=t7+ a video signal is received at input terminal 38 by circuit 11. This video signal, which also contains distortions and noise associated with CCD 100 and circuitry 102, causes terminal 38 to drop to a voltage level V3 that is less positive than V2 by T=t8. The dash line between T=t8 and t11 indicates that the level of V3 is a function of the video signal received. At T=t11 a first cycle of operation is completed and a second essentially identical cycle starts.

Referring now to FIG. 3, there is graphically shown a clamp voltage wave form applied to terminal 46 (the gate of transistor 12) with voltage V(volts) plotted on the y axis and time T(nano-seconds) plotted on the x-axis. The time axis of the wave form of FIG. 3 corresponds to that of FIG. 2. During the time periods T=t5 to t6 and t15 to t16, the voltage applied to terminal 46 is a high (a "1") which enables (biases on) transistor 12. During all other times the voltage applied to terminal 46 is a low (a "0") which disables (biases off) transistor 12.

Figure 4:
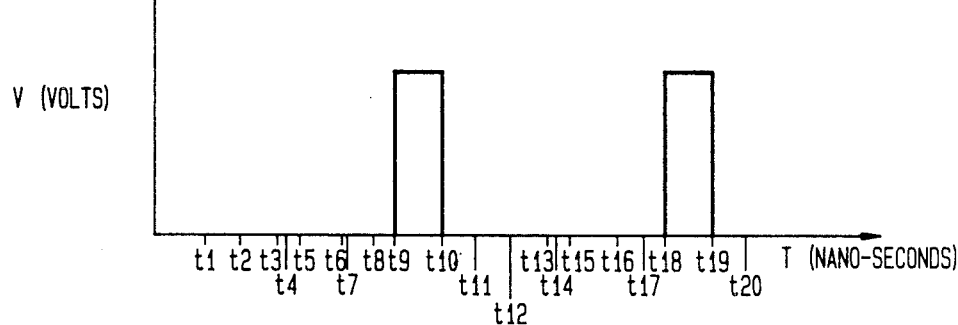
FIG. 4 graphically shows a second control signal used to control the circuit of FIG. 1.

Referring now to FIG. 4, there is graphically shown a sample voltage wave form applied to terminal 48 (the gate of transistor 21) with voltage V(volts) plotted on the y-axis and time T(nano seconds) plotted on the x-axis. The time axis of the wave form of FIG. 4 corresponds to that of FIG. 2. During the time periods T=t9 to t10 and t19 to t20, the voltage applied to terminal 48 is a high (a "1") which enables (biases on) transistor 21. During all other times the voltage applied to terminal 48 is a low (a "0") which disables (biases off) transistor 21.

Figure 5:
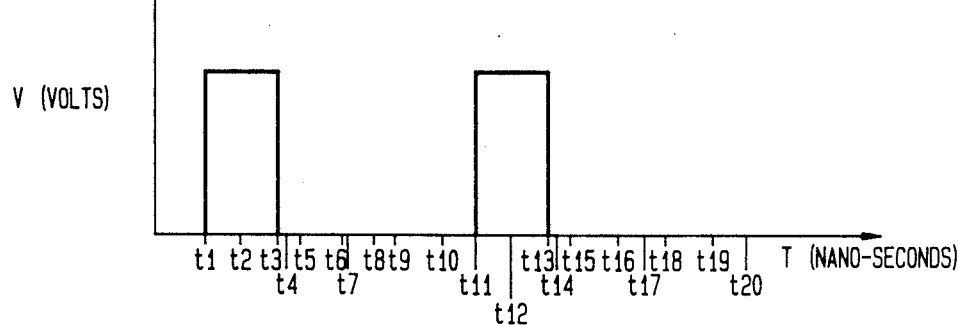
FIG. 5 graphically shows a third control signal used to control the circuit of FIG. 1.

Referring now to FIG. 5, there is graphically shown a sample voltage wave form applied to terminal 50 (the gates of transistors 15 and 17) with voltage V(volts) plotted on the y axis and time T(nano seconds) plotted on the x axis. The time axis of the wave form of FIG. 5 corresponds to that of FIG. 2. During the time periods T=t1 to t3 and t11 to t13, the voltage applied to terminal 50 is a high (a "1") which enables (biases on) transistors 15 and 17. During all other times the voltage applied to terminal 50 is a low (a "0") which disables (biases off) transistors 15 and 17.

Circuit 11 operates as follows: During T=t1 to t5- transistors 12 and 21 are disabled (biased off) since a low, a "0", is applied to the gates (terminals 46 and 48) of transistors 12 and 21. Accordingly, any signal applied to input terminal 38 is blocked from reaching capacitors 22 and 23. During the same time period transistors 15 and 17 are enabled (biased On) because a "1" is applied to the gates (terminal 50) thereof. Voltages previously applied to terminals 53 and 57 during a previous cycle are now coupled to terminals 54 and 55, respectively. These voltages are then processed by sources followers 18 and 16, respectively and then after appropriate voltage division by resistors 28, 30, 32 and 34 are processed by differential amplifier 36. This portion of the operation will be explained in more detail at during the discussion of the next cycle of operation. At T=t5 the signal (see FIG. 2) applied to the gate (terminal 46) of transistor 12 is pulsed to a "1" and is held there until T=t6. This enables (biases on) transistor 12 and thus the signal applied to terminal 38 during T=t5+ to t6- is transferred through transistor 12 and is stored as the voltage level V2 on terminal 52 of capacitor 22. Transistor 21 is disabled during this time period and therefore the signal applied to input terminal 38 and to terminal 52 (the first terminal of capacitor 22) can not reach capacitor 23. By T t6+ the voltage of terminal 52 is set to V2 which includes distortion and noise signals generated by CCD 100 and circuitry 102. At T=t6+ the voltage applied to terminal 46 (the gate of transistor 12) is a "0" and transistor 12 is disabled. This leaves capacitor 22 electrically floating in potential at the previously set level V2 which includes distortions and noise signals generated by CCD 100 and circuitry 102 electrically isolates terminal 50 from input terminal 38.

Between T=t9+ and t10-, the voltage applied to terminal 48 is set to and held at a "1" which enables transistor 21. Transistor 12 is disabled during this time period since the gate thereof (terminal 46) is held at a "0". The signal applied to inPut terminal 38 during this time period (T=t9+ to t10-) passes through enabled transistor 21 and charges capacitor 23 (terminal 59) to the voltage V3 of a signal voltage generated by CCD 100 and transferred via circuitry 102 to input terminal 38. Accordingly, a voltage level V2, which includes the distortion and noise of CCD 100 and circuitry 102 but no video signal, reaches terminal 52 and the output video signal voltage of CCD 100 and circuitry 102, which also includes distortion and noise of CCD 100 and circuitry 102, reaches terminal 59.

The reference voltage V2 first applied to the gate of transistor 13 causes it to be enabled and conduct current therethrough. Thus a current path from Vdd through transistors 13 and 14 is created which causes a voltage to be generated at terminal 53 (the source of transistor 13). Since transistors 13 and 14 form a buffer circuit with transistor 13 acting essentially as a source follower, the voltage created at terminal 53 is essentially the same as exists at terminal 52.

The signal voltage V3 next applied to the gate of transistor 19 causes it to be enabled and conduct current therethrough. Thus a current path from Vdd through transistors 19 and 20 is created which causes a voltage to be generated at terminal 57 (the source of transistor 19). Since transistors 19 and 20 form a buffer circuit with transistor 19 acting essentially as a source follower, the voltage created at terminal 57 is essentially the same as exists at terminal 59.

Between T=t11+ and t13- transistors 15 and 17 are enabled by the "1" signal level applied to terminal 50. Accordingly, the voltages V2 and V3 at terminals 53 and 57 are effectively transferred through transistors 15 and 17, respectively, and charge terminals 54 and 55 to V2 and V3, respectively.

Transistors 16 and 18 act essentially as relatively high input impedance source followers. Accordingly, the voltages on terminals 60 and 62 (which are ideally the same as those on terminals 52 and 54, respectively) after appropriate voltage division by resistors 28 and 30 and 32 and 34, appear at the inputs (terminals 56 and 58, respectively) of differential amplifier 36. Since in the preferred embodiment CCD 100 and circuitry 102 and all of circuit 11, except for resistors 28, 30, 32 and 34 and differential amplifier 36, are on a common semiconductor substrate 13, any noise signals traveling via the substrate 13 equally modify the voltages appearing at terminals 60 and 62. These signals can only reach differential amplifier 36 at the input terminals 56 and 58 since differential amplifier and resistors 28, 30, 32 and 34 are not on the same substrate 13 as the rest of system 10. Accordingly, the noise associated with CCD 100 and circuitry 102 are effectively cancelled by differential amplifier 36 and do not appear at system 10 output terminal 40. Only the desired video signal of CCD 100 and circuitry 102, essentially free of noise and distortion, reaches system 10 output terminal 40.

The circuit 11 of this invention couples noise and distortions essentially equally to terminals 60 and 62 which are coupled to an off chip 13 differential amplifier which subtracts the reference level from the video level to generate a video output signal at output terminal 40 which is the desired true video signal.

It is to be understood that the specific components mentioned in this specification are exemplary embodiments that are intended merely to be illustrative of the spirit and scope of the claims of this invention. Modifications can readily be made by those skilled in the electronic arts consistent with the principles of this invention. For example, a variety of different sample and hold circuits, buffer circuits and source followers can be used.

I claim:

1. Circuitry comprising:

first, second third and fourth sample and hold circuits each having a control terminal, an input terminal and an output terminal;

the input terminals of the first and second sample and hold circuits being coupled together to a circuitry input terminal;

first and second buffer circuits each having an input terminal and an output terminal;

the output terminal of the first sample and hold circuit being coupled to the input terminal of the first buffer circuit;

the output terminal of the second sample and hold circuit being coupled to the input terminal of the second buffer circuit;

the output terminal of the first buffer circuit being coupled to the input terminal of the third sample and hold circuit;

the output terminal of the second buffer circuit being coupled to the input terminal of the fourth sample and hold circuit;

first and second essentially identical source followers each having a control terminal and an output terminal;

the output of the third sample and hold circuit being coupled to the control terminal of the first source follower;

the output terminal of the fourth sample and hold circuit being coupled to the control terminal of the second source follower;

subtraction means, which has a first input coupled to the output of the first source follower, has a second input coupled to the output of the second source follower and has an output coupled to a circuitry output terminal, for during operation of the circuitry subtracting signals appearing on the outputs of the source followers from each other to generate an output signal which is the difference between signals appearing on the output terminals of the source followers; and the sample and hold circuits, the buffer circuits, and the source followers being formed on a common semiconductor body which does not include the subtraction means.

2. The circuitry of claim 1 wherein the subtraction means is a differential amplifier and each of the sample and hold circuits comprises a separate storage means and a separate switching device.

3. The circuitry of claim 2 wherein each of the storage means is a capacitor and each of the source followers is a separate transistor.

4. The circuitry of claim 3 wherein:

each of the transistors is an n-channel metal-oxide-semiconductor transistor;

the capacitors of the first and second sample and hold circuits are essentially identical; and the capacitors of the third and fourth sample and hold circuits are essentially identical.

* * * * *